United States Patent [19]

Nishibe et al.

[11] Patent Number: 5,453,669
[45] Date of Patent: Sep. 26, 1995

[54] MOTOR CURRENT DETECTION CIRCUIT

[75] Inventors: Yasushi Nishibe; Hitoshi Iwata, both of Niwa, Japan

[73] Assignee: Kabushiki Kaisha Tokai-Rika-Denki-Seisakusho, Japan

[21] Appl. No.: 251,347

[22] Filed: May 31, 1994

[30] Foreign Application Priority Data

Jun. 4, 1993 [JP] Japan ................... 5-134718
Aug. 25, 1993 [JP] Japan ................... 5-210575

[51] Int. Cl.⁶ ............................................. H02K 17/32
[52] U.S. Cl. ........................ 318/434; 318/432; 318/433; 318/476
[58] Field of Search ........................ 318/434, 432, 318/433, 476

[56] References Cited

U.S. PATENT DOCUMENTS

| | | | |
|---|---|---|---|
| 4,574,226 | 3/1986 | Binder | 318/434 |
| 4,810,943 | 3/1989 | Kawaguchi et al. | 318/434 |
| 4,985,666 | 1/1991 | Nakabayashi | 318/434 |
| 5,214,359 | 5/1993 | Herndon et al. | 318/434 |
| 5,268,623 | 12/1993 | Müller | 318/434 |
| 5,341,077 | 8/1994 | Chen et al. | 318/434 |
| 5,341,891 | 8/1994 | Wada et al. | 318/434 |

FOREIGN PATENT DOCUMENTS 61-39873  2/1986  Japan.
3-81484   4/1991  Japan.

*Primary Examiner*—William M. Shoop, Jr.
*Assistant Examiner*—Karen Masih
*Attorney, Agent, or Firm*—Oliff & Berridge

[57] ABSTRACT

A motor current detection circuit in which a level for detecting an overload state is varied when motor drive voltage varies so as to prevent erroneous detection due to variation in-motor current which occurs when the drive voltage varies.

18 Claims, 5 Drawing Sheets

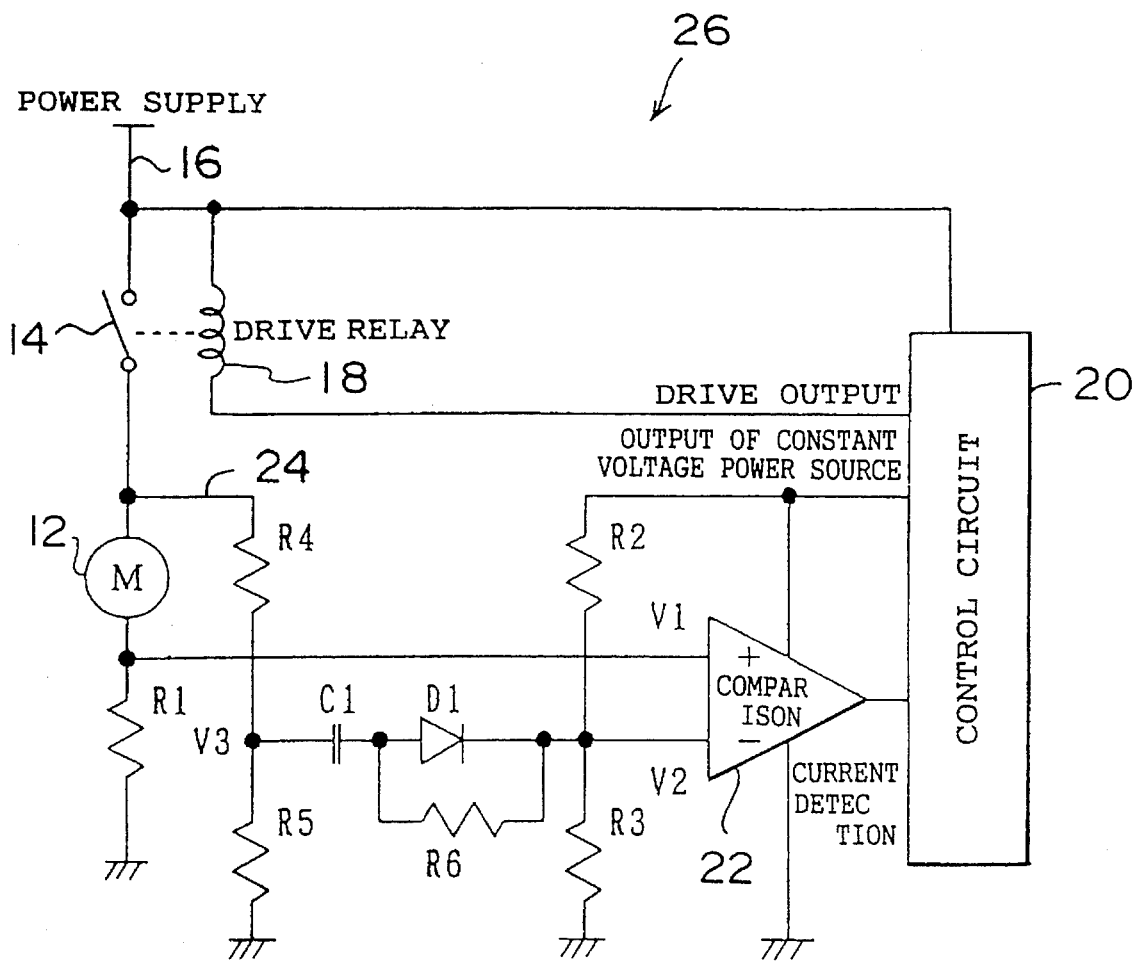

MOTOR CURRENT DETECTION CIRCUIT

BACKGROUND OF THE INVENTION

1. Field of the Invention

The present invention relates to a motor current detection circuit which detects an overloaded state of the motor based on an increase in motor current.

2. Description of the Related Art

For example, a power window apparatus is provided with a motor for raising and lowering a door glass. In a case in which a foreign object is caught between the door glass and a door frame during the time when the door glass is being raised by the power window apparatus, a variation occurs in the load of the motor. An overload of the motor is detected based on an increase in motor current, and measures are taken such as stopping the upward movement of the door glass, or reversing the direction of movement of the door glass.

In an automatic mode, once the contact for raising or the contact for lowering of an auto-switch is turned on, driving of the motor is continued until the door glass is completely closed or is completely opened even after a driver releases the auto-switch. Therefore, it is useful to detect the motor current so as to carry out the above-described measures against overloading.

When the door glass has been closed completely, the motor may be overloaded causing an increase in the current flowing through the motor. Therefore, a full-closure detecting sensor is provided in the proximity of a full-closure position so as to discriminate the catching of a foreign object and the full-closure of the door glass.

However, when motor drive voltage for driving a motor varies, motor current also varies accordingly. Therefore, there is a fear that an overload of the motor is erroneously detected. Generally, motor current varies independent from motor drive voltage, but dependent on the load imposed on the motor. However, when motor drive voltage abruptly varies, motor current temporarily varies in accordance with the variation in the motor drive voltage.

For example, when motor drive voltage increases, current increases as in the case of a rush current by an amount corresponding to the amount of increase of the motor drive voltage. In this case, there is a possibility that the current exceeds a threshold value which is determinant for judging whether the current is abnormal or not. Also, when motor drive voltage decreases, current varies as in the case of a rush current but in a direction opposite to that of the rush current, namely in the direction of decrease, the difference between the current and the threshold value considerably increases. In this case, there is a possibility that the current does not exceed the threshold value even when an abnormal state occurs.

SUMMARY OF THE INVENTION

The present invention has been accomplished in view of the above-mentioned facts. An object of the present invention is to provide an improved motor current detection circuit which is capable of reliably detecting an abnormal increase in current (hereinafter referred to as "abnormal current") even when motor current varies depending on a variation of motor drive voltage.

In a first aspect of the present invention, a motor current detection circuit is provided for detecting an overload of a motor by detecting an increase in motor current which includes comparing means for comparing motor current and a current value corresponding to a level for detecting overload (hereinafter referred to as "overload detection level"), and detection level changing means for changing the current value corresponding to the overload detection level in accordance with variation of motor drive voltage so as to maintain the difference between the current value corresponding to the overload detection level and the value of current flowing through the motor at the time when the motor is driven normally.

In a second aspect of the present invention, a motor current detection circuit is provided for detecting an overload of a motor by detecting an increase in motor current which includes comparing means for comparing the motor current and a current value corresponding to a overload detection level, detection level changing means for changing the current value corresponding to the overload detection level in accordance with variation in motor drive voltage, and restricting means for restricting an amount of variation in the current value corresponding to the detection level, when the current value corresponding to the detection level is changed by the detection level changing means in accordance with a decrease in said motor drive voltage, so that the amount of variation in the current value corresponding to the detection level is prevented from exceeding a predetermined amount.

According to the first aspect of the present invention, even though it is preferred that the overload detection level be constant, the detection level changing means is employed for varying the current value corresponding to the overload detection level in accordance with variation in the motor drive voltage so as to maintain the difference between the current value corresponding to the overload detection level and the value of current flowing through the motor in a normal state. This variation in the current value is effected because the current flowing through the motor varies as the motor drive voltage varies. Accordingly, when the current abnormally increases due to an overload imposed on the motor, the abnormal current is reliably detected regardless of variation in the motor drive voltage. Also, it is prevented from erroneously detecting a variation in current due to a variation in the motor drive voltage as an abnormal current.

In the case where the motor drive voltage increases, it is preferred that the current value corresponding to the detection level be increased, by the detection level changing means, by an amount corresponding to the amount of the increase in the motor drive voltage. However, if the current value corresponding to the detection level is decreased by an amount corresponding to the amount of decease in the drive voltage when such decrease occurs, the current value corresponding to the detection level excessively decreased, thereby raising a possibility that the current value corresponding to the detection level becomes equal to or less than the value of normal or ordinary motor current.

Therefore, according to the second aspect of the present invention, the restricting means restricts the variation of the current value corresponding to the detection level, when the motor drive voltage decreases, so as to prevent erroneous detection which would otherwise occur when the current value corresponding to the detection level becomes lower than the motor current at the time when the motor is normally driven.

Accordingly, it is possible to compensate for variation in the motor drive voltage by a simple circuit.

As described above, the motor current detection circuit according to the present invention has an excellent effect in that it reliably detects abnormal current even when the motor current varies in accordance with a variation in the motor drive voltage.

BRIEF DESCRIPTION OF THE ACCOMPANYING DRAWINGS

FIG. 3 is a diagram showing a motor drive circuit according to a second embodiment of the present invention;

DETAILED DESCRIPTION OF THE PREFERRED EMBODIMENTS

First embodiment

Figure 1:
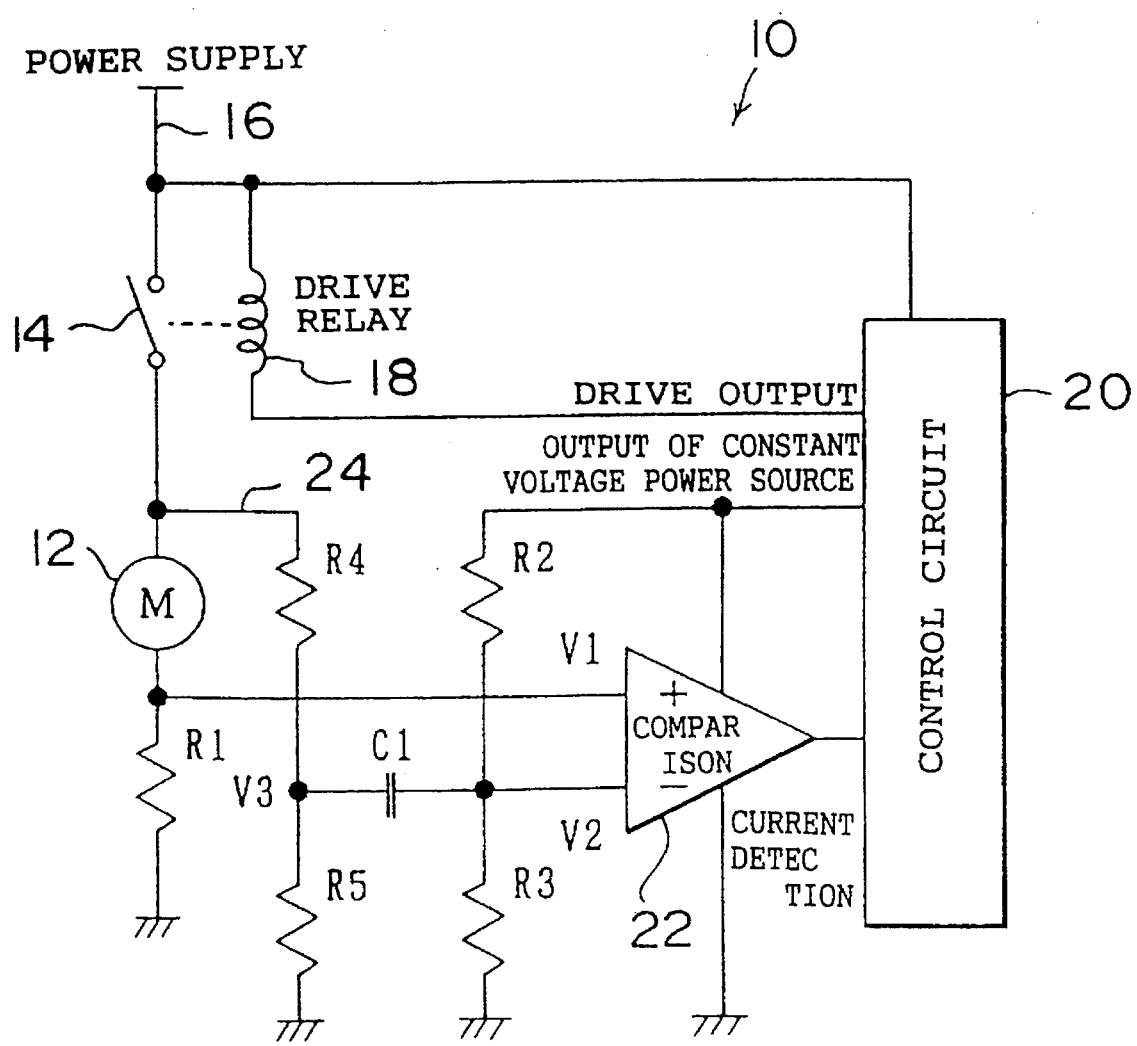
FIG. 1 is a diagram showing a motor drive circuit according to a first embodiment of the present invention.

FIG. 1 shows a motor drive circuit 10 according to a first embodiment of the present invention.

One terminal of a motor 12 is connected to one terminal of a relay switch 14, and the other terminal of the motor 12 is grounded via a resistor R1. Since the other terminal of the relay switch 14 is connected to a power supply line 16, the motor 12 is driven when the relay switch 14 is turned on. The operation for turning on and turning off the relay switch 14 is effected by controlling the excitement of a relay coil 18.

Both terminals of the relay coil 18 are connected to a control circuit 20. The power supply line 16 is also connected to the control circuit 20 so as to allow the control circuit 20 to start and stop the supply of electricity to the relay coil 18.

An output terminal of a comparator 22 is connected to the control circuit 20, and initiation and termination of the supply of electricity to the relay coil 18 is controlled based on the level of output from the output terminal.

Connected to a positive input terminal of the comparator 22 is a branch line branched from a line between the motor 12 and the resistor R1. Therefore, when motor current flows through the resistor R1, voltage V1 corresponding to the motor current is input to the positive input terminal.

Also, a constant voltage power source in the controller 20 is connected to a negative input terminal of the comparator 22 via a resistor R2, while the negative input terminal is grounded via a resistor R3. Accordingly, the negative input terminal is supplied with voltage V2 obtained by dividing output voltage of the constant voltage power source at the resistors R2 and R3.

The above-described elements form an ordinary detection circuit for detecting motor current. The voltage V1 representing motor current is compared with the voltage V2 representing a threshold value, and a high-level signal is output from the output terminal of the comparator 22 when the voltage V1 exceeds the voltage V2. In response to the output of the high-level signal, the excitement of the relay coil 18 is stopped so as to terminate the driving of the motor 12.

In the present embodiment, a branch line 24 is connected to the motor 12 at a side closer to the power supply line 16, and the branch line 24 is grounded via serially connected resistors R4 and R5. An intermediate point between the resistors R4 and R5 is connected to an intermediate point between the resistors R2 and R3 through a capacitor C1.

The voltage V3 which is obtained by dividing the power source voltage at the resistors R4 and R5 varies depending on variation in the power source voltage. When the power source voltage increases, the voltage V3 becomes greater than the voltage V2 so that current flows from the capacitor C1 to the resistor R3. As a result, the potential at the negative input terminal of the comparator 22, i.e., the threshold value increases by an amount corresponding to the amount of the increase in the power source voltage. With this operation, the difference between the voltage V1 corresponding to the drive current of the motor 12 and the voltage V2 corresponding to the threshold value is always maintained constant if the load of the motor does not change.

On the contrary, when the power source voltage decreases, the voltage V3 becomes smaller than the voltage V2 so that current flows from the resistor R3 to the capacitor C1. As a result, the voltage V2 decreases so that the threshold value is lowered accordingly.

As described above, since the voltage V2 (threshold value) is changed in accordance with variation in the power source voltage, the difference between the voltage V1 corresponding to the drive current of the motor 12 and the voltage V2 is maintained almost constant if the load of the motor does not change.

The operation of the first embodiment will be described below.

When the relay coil 18 is excited by the control circuit 20, the relay switch 14 is turned on so that the driving of the motor is started. The voltage V1 corresponding to motor current is constant during a time period indicated by an arrow A in FIG. 2A, in which the motor 12 is in a normal or ordinary state. However, when the power source voltage abruptly varies (increases), the motor current increases in a way similar to the case where a rush current flows. Accordingly, the voltage V1 drastically increases, and it sometimes exceeds the threshold value if a conventional circuit, which does not increase the threshold value V2, is used. In the present embodiment, since the voltage V3 increases in accordance with increase in the power source voltage, the relationship V3>V2 is satisfied when the power source voltage increases, which causes a flow of current from the capacitor C1 to the resistor R3. Accordingly, the voltage between the both ends of the resistor R3 increases by an amount corresponding to the amount of the current so that the voltage V2 acting as the threshold value is varied. Since the amount of the variation corresponds to the amount of the current flowing from the capacitor C1 to the resistor R3, i.e., corresponds to the variation in the power source voltage, the threshold value (voltage V2) can be increased when the motor current increases due to an abrupt increase of the power source voltage. Therefore, in a state in which the load acting on the motor 12 does not change, the difference between the voltage V1 and the voltage V2 is maintained constant, thereby preventing erroneous detection of abnormal current.

Also, since ordinary variation in the power source voltage is absorbed by the capacitor C1, the threshold value does not vary when the power source voltage varies independently from the motor current.

Figure 2A:
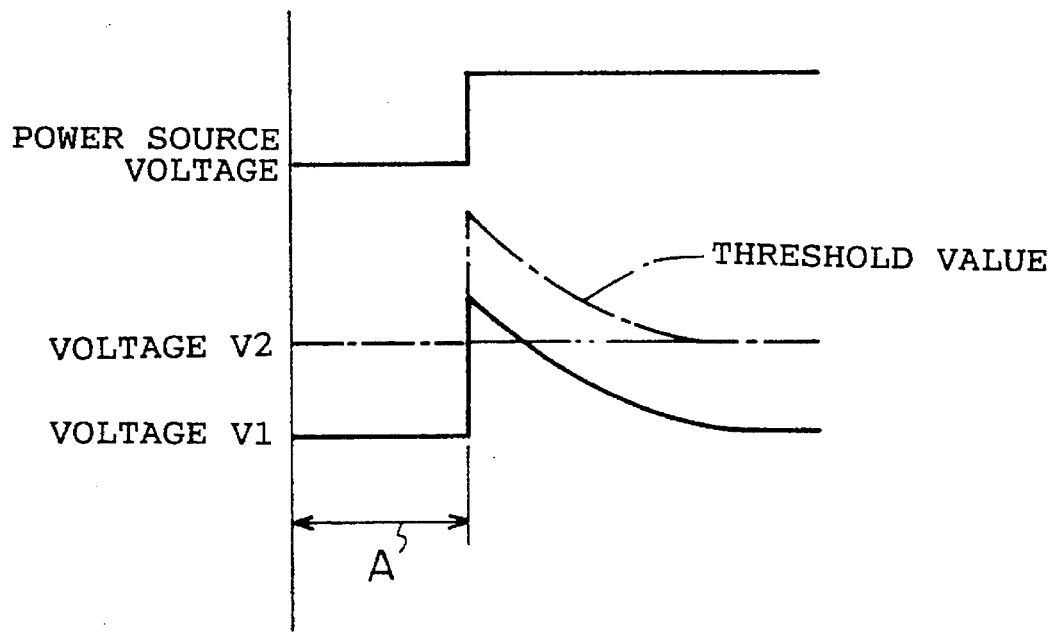
FIG. 2A is a graph showing the relationship between voltage V1 representing motor current and voltage V2 representing a threshold value in the circuit shown in FIG. 1 in a state in which the voltage of a power source increases.
Figure 2B:
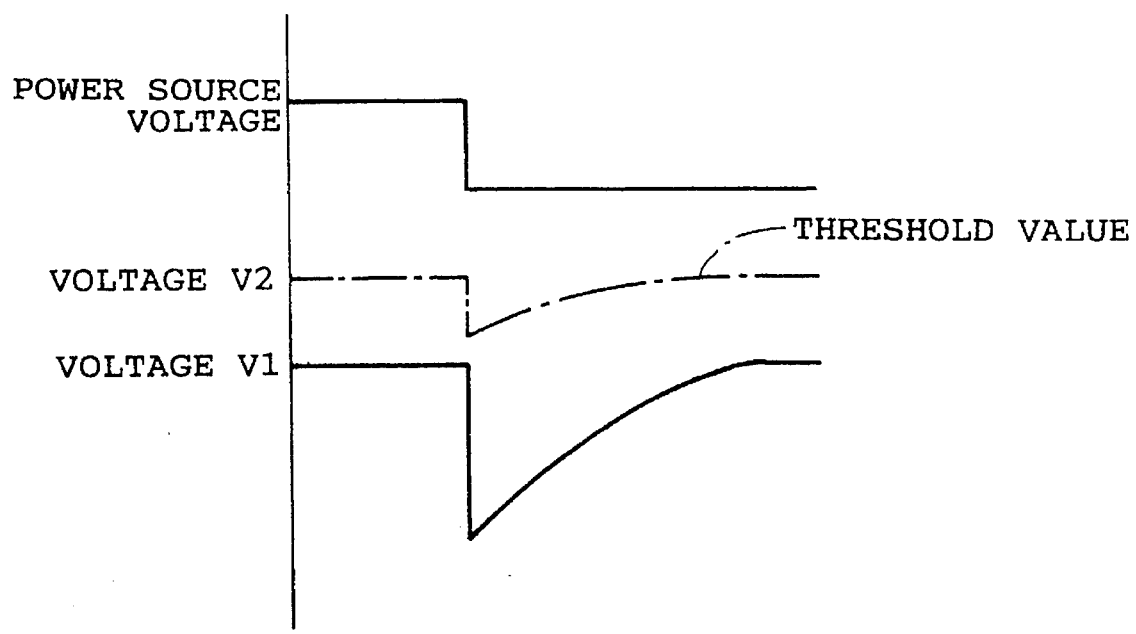
FIG. 2B is a graph showing the relationship between the voltage V1 representing motor current and the voltage V2 representing the threshold value in the circuit shown in FIG. 1 in a state in which the voltage of the power source decreases.

As shown in FIG. 2B, when the power source voltage abruptly decreases, the motor current also decreases in a way similar to the case of a rush current except that the direction of variation is opposite to that in the rush current. During the period in which the power source voltage abruptly decreases, the voltage V3 becomes smaller than the voltage V2 so that current flows from the resistor R2 to the capacitor C1. As a result, the voltage V2 acting as the threshold value varies. Since the amount of the variation corresponds to the amount of the current flowing from the resistor R2 to the capacitor C1, i.e., corresponds to the variation in the power source voltage, it is possible to cause the threshold value (voltage V2) to follow the variation in the power source voltage.

Second embodiment

A second embodiment of the present invention will be described below. Elements which are the same as those in the above-described first embodiment are denoted by the same reference symbols, and a detailed description thereof will be omitted.

The feature of the second embodiment lies in the control in which the threshold value is prevented from becoming smaller than the value of motor current in ordinary state when the threshold value is changed in accordance with an abrupt decrease in the power source voltage.

As shown in FIG. 3, in a motor drive circuit 26, a branch line 24 is connected to the motor 12 at a side closer to a power supply line 16, and the branch line 24 is grounded via serially connected resistors R4 and R5. One terminal of a capacitor C1 is connected to an intermediate point between the resistor R4 and R5 while the other terminal of the capacitor C1 is connected to a diode D1 at its anode side. The cathode of the diode D1 is connected to an intermediate point between a resistor R2 and a resistor R3.

Further, a resistor R6 is connected between the anode and the cathode of the diode D1.

Figure 4A:
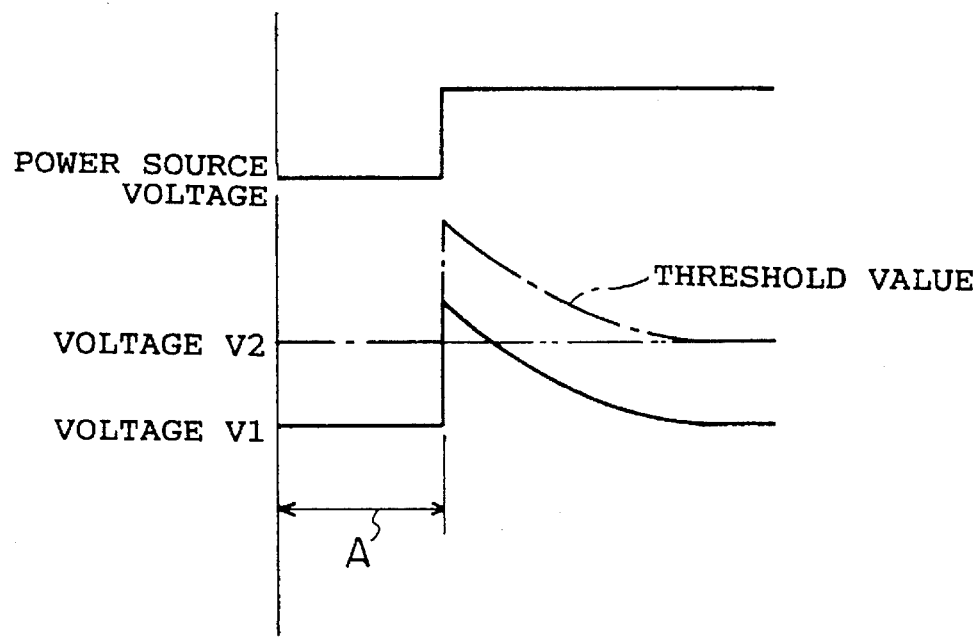
FIG. 4A is a graph showing the relationship between voltage V1 representing motor current and voltage V2 representing a threshold value in the circuit shown in FIG. 2 in a state in which the voltage of a power source increases.

By employing the above-described structure, current flows through the diode D1 when voltage V3 becomes greater than voltage V2 due to an abrupt increase in the power source voltage as shown in FIG. 4A. In this case, the threshold value is increased in accordance with the increases in the power source voltage as in the first embodiment so that the voltage V1 corresponding to motor current and the voltage V2 acting as the threshold value is maintained constant.

Figure 4B:
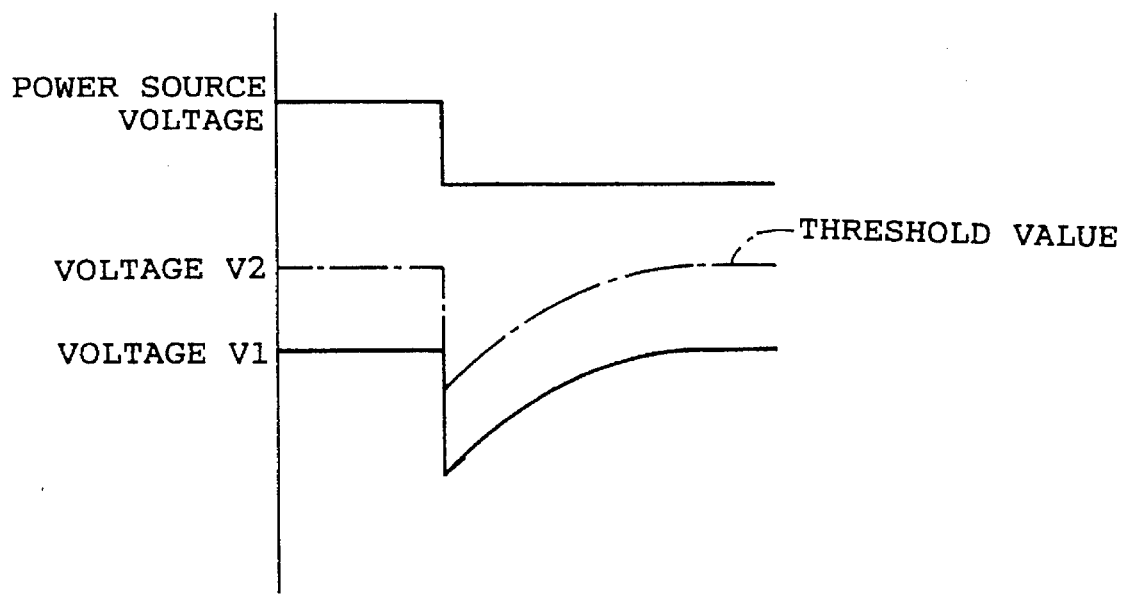
FIG. 4B is a graph showing the relationship between the voltage V1 representing motor current and the voltage V2 representing the threshold value in the circuit shown in FIG. 2 in a state in which the voltage of the power source decreases.

On the contrary, when the power source voltage abruptly decreases, the voltage V3 becomes smaller than the voltage V2 as shown in FIG. 4B. In the first embodiment, the threshold value is lowered in accordance with such a decrease in the power supply voltage. When the amount of decrease in the power source voltage is small, no problems occur. However, when the amount of decrease in the power source voltage is large, there is a possibility that the voltage V2 acting as the threshold value becomes smaller than the voltage V1 corresponding to the motor current so that an erroneous detection may be made. Therefore, in the second embodiment, the circuit is designed such that, when the voltage V3 becomes smaller than the voltage V2, the flow of current from the resistor R2 to the capacitor C1 is prohibited by the diode D1, which flow of current would otherwise occur. In this case, the voltage V2 decreases by an amount corresponding to the amount of current flowing through the resistor R6. Accordingly, the voltage V2 does not become smaller than the voltage V1 corresponding to the motor current even when the power source voltage abruptly decreases. Since it is possible to reliably detect current exceeding an absolute abnormal current (i.e. a threshold value in the state where the power source voltage is stable), there is no fear that overload of the motor 12 is overlooked.

Although the resistor R6 is connected between the anode and the cathode of the diode D1 in the second embodiment, the circuit may be modified such that one end of the resistor R6 is connected to the cathode of the diode D1 and the other end of the resistor R6 is grounded so as to prevent the threshold value from varying when the power source voltage decreases.

As described above, overload of the motor is judged by detecting motor current, and the threshold value is varied in accordance with a variation in motor current which is caused by an abrupt variation in the power source voltage. Accordingly, it is possible to prevent overload from being erroneously detected.

In the second embodiment, the degree of variation of the threshold value is changed depending on whether the power source voltage increases or decreases. Therefore, it is possible to compensate for variation in the power source voltage using a simple circuit.

Third Embodiment

Next, a third embodiment of the present invention will be described with reference to FIG. 5. Elements which are the same as those in the above-described first embodiment are denoted by the same reference symbols, and a detailed description thereof will be omitted.

Figure 5:
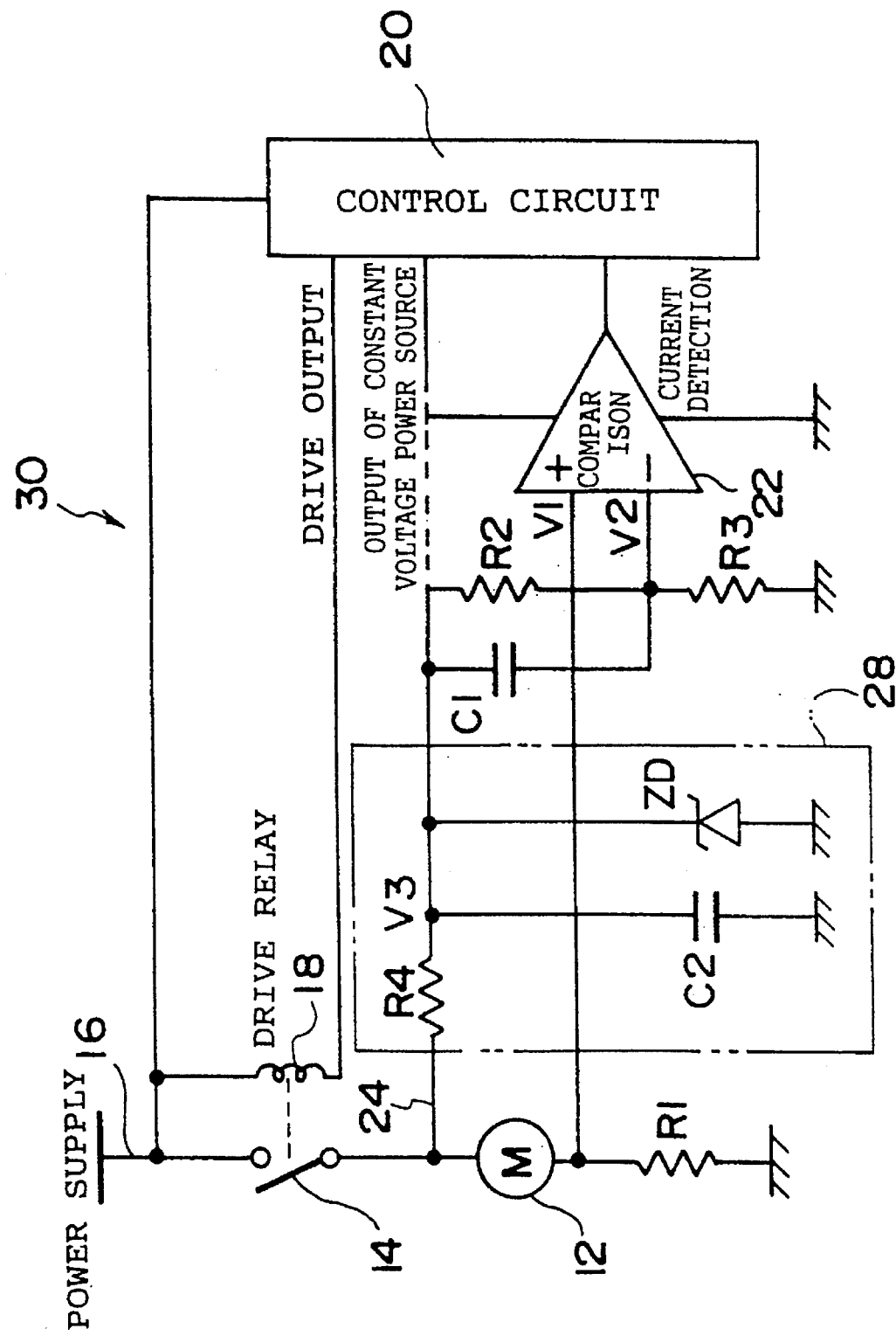
FIG. 5 is a diagram showing a motor drive circuit according to a third embodiment of the present invention.

FIG. 5 shows a motor drive circuit 30 according to the third embodiment. In the drive circuit 30, one end of the resistor 4 is connected to a motor 12 at its power source side, while the other end of the resistor R4 is grounded via a serial circuit of resistors R2 and R3. A capacitor C2 is connected between the other end of the resistor R4 and the ground, and a Zener diode ZD is connected to the capacitor C2 in parallel. Accordingly, a voltage regulating circuit 28 is formed by the resistor R4, the capacitor C2 and the Zener diode ZD when the motor 12 is normally driven. Output voltage V3 of the voltage regulating circuit 28 is divided by the resistors R2 and R3 and the divided voltage V2 is input to a negative input terminal of a comparator 22 as a reference voltage. Voltage output from a constant voltage power source in a control circuit 20 is not input to the comparator 22.

Further, a capacitor C1 is connected to the resistor R2 in parallel. The capacitor C1 and the resistor R4 constitute detection level changing means. The remaining portion of the circuit is the same as that in the first embodiment.

In the motor drive circuit according the third embodiment which has the above-described structure, the voltage V1 corresponding to motor current is constant in the period indicated by an arrow A in FIG. 2A in which the motor is normally driven. In such a state, the output voltage V3 of the voltage regulating circuit 28 is maintained to be equal to the Zener voltage $V_{ZD}$, and voltage V2 obtained by dividing the Zener voltage $V_{ZD}$ at the resistors R2 and R3 is input to the comparator 22 as a reference voltage (detection level). When the power source voltage (motor drive voltage) increases, current flowing through the resistor R4 increases so that the output voltage V3 of the voltage regulating circuit 28 increases due to the operational resistance of the Zener diode ZD. As a result, charging of the capacitor C1 is started so that the reference voltage V2 for the comparator 22 increases (see FIG. 2A).

The voltage V2 gradually decreases as the amount of charge in the capacitor C1 increases, and the decrease of the voltage V2 stops when the capacitor C1 has been completely charged. As a result, the voltage V2 varies in a way shown in FIG. 2A. With this operation, the difference between the voltage V1 corresponding to motor current and the voltage V2 corresponding to the threshold value is maintained constant.

On the other hand, when the power source voltage decreases, current flowing through the resistor R4 decreases contrary to the above so that the reference voltage V2 decreases (see FIG. 2B). In this case, discharge of the capacitor C1 is started so that the voltage V2 gradually increases in a way shown in FIG, 2B.

As described above, in the present embodiment, the voltage V2 (threshold value) is changed in accordance with variation in the power source voltage. Therefore, the difference between the voltage V1 corresponding to the drive current of the motor 12 in the ordinary state and the voltage V2 is maintained almost constant.

Accordingly, in the motor drive circuit of the third embodiment, the difference between the voltage V1 and the voltage V2 is made constant regardless of variation in the power source voltage if the load of the motor does not change. Therefore, there is no fear to erroneously detect abnormal current, similar to the first embodiment.

Moreover, the circuit according to the third embodiment can mask or ignore rush current which flows through the motor when the supply of power is started.

Further, the circuit may be modified such that the resistor R4 is connected to the power source instead of the terminal of the motor, and a circuit illustrated by a broken line in FIG. 5 is closed so as to form a voltage regulating circuit for the control circuit 20. This modified circuit also prevents erroneous detection of overload which would otherwise occur due to variation in the power source voltage.

Applications of the above-described overload detection circuits for motors include use in a power window apparatus. When a foreign object is caught during an upward movement of a door glass by the driving force of a motor, an overload acts on the motor, and motor current increases accordingly. When the value of the motor current exceeds a threshold value, the driving by the motor is stopped immediately or after a reverse rotation for a predetermined period of time, whereby the foreign object is prevented from being damaged.

In such a power window apparatus, the power source voltage, i.e., the voltage of a battery varies when one of other electrical apparatuses (air conditioner, lamp and the like) are turned on or turned off. In the above-described circuits, since the threshold value is changed in accordance with variation in the power source voltage, it is possible to solve conventional problems such that the door glass stops in the middle of movement and that the catching of an foreign object cannot be detected.

In the above-described embodiments, the threshold value (voltage V2) is changed by an analog circuit in accordance with power source voltage (motor drive voltage). However, it is possible to prepare a computer program for varying the threshold value in accordance with an abrupt change in the motor drive voltage, and to store the program in the control circuit 20 for controlling the threshold value.

What is claimed is:

1. A motor current detection circuit for detecting an overload of a motor by detecting an increase in motor current, comprising:

comparing means for comparing said motor current and a current value corresponding to a variable overload detection level; and detection level changing means for varying said current value corresponding to the variable overload detection level based on variation in a voltage supplied to said motor.

2. A motor current detection circuit according to claim 1, wherein said detection level changing means maintains a difference between said current value corresponding to the variable overload detection level and a value of current flowing through the motor at a time when the motor is driven without overload.

3. A motor current detection circuit according to claim 1, wherein said detection level changing means changes said current value corresponding to the variable overload detection level by an amount corresponding to an amount by which the motor current varies when the motor drive voltage varies.

4. A motor current detection circuit according to claim 3, wherein said detection level changing means increases said current value corresponding to the variable overload detection level by an amount corresponding to an amount of increase in said motor current.

5. A motor current detection circuit according to claim 1, wherein said detection level changing means sets an amount of variation in said current value corresponding to the variable overload detection level to be smaller than an amount of variation in said motor drive voltage.

6. A motor current detection circuit according to claim 1, wherein said detection level changing means comprises of a capacitor element connected between one terminal of said motor and said comparing means.

7. A motor current detection circuit according to claim 1, wherein said current corresponding to the variable overload detection level is output from a control circuit which effects control depending on results of comparison by said comparing means and from said capacitor element.

8. A motor current detection circuit according to claim 1, further comprising masking means for preventing a rush current, which flows through the motor when the supply of power is started, from being detected as an abnormal current.

9. A motor current detection circuit according to claim 8, wherein said masking means comprises of a circuit connected to a power source and said comparing means and in which a capacitor element and a resistor are disposed in parallel with each other.

10. A motor current detection circuit according to claim 8, wherein said masking means is connected to a control circuit which effects control depending on results of comparison by said comparing means.

11. A motor current detection circuit for detecting an overload of a motor by detecting an increase in motor current, comprising:

comparing means for comparing said motor current and a current value corresponding to a variable overload detection level; and detection level changing means for varying said current value corresponding to the variable overload detection level based on a variation in a voltage supplied to said motor, and for changing an amount of variation of said current value corresponding to the variable overload detection level depending on whether the motor current increases or decreases.

12. A motor current detection circuit according to claim 11, wherein when the motor current decreases, said current value corresponding to the variable overload detection level changes by an amount smaller than that in a case in which the current increases.

13. A motor current detection circuit according to claim 11, wherein when the motor current decreases, said current value corresponding to the variable overload detection level is prevented from changing in a case in which the motor current increases.

14. A motor current detection circuit for detecting an overload of a motor by detecting an increase in motor current, comprising:

comparing means for comparing said motor current and a current value corresponding to a variable overload detection level;

detection level changing means for changing said current value corresponding to the overload detection level based on variation in a voltage supplied to said motor; and restricting means for restricting an amount of variation in the current value corresponding to the variable overload detection level from exceeding a predetermined amount when the current value corresponding to the variable overload detection level is changed by said variable overload detection level changing means based on a decrease in said motor drive voltage.

15. A motor current detection circuit according to claim 14, wherein said predetermined amount is a value of motor current at a time when said current value corresponding to the variable overload detection level is changed.

16. A motor current detection circuit according to claim 14, wherein said restricting means comprises a rectifier element provided between one terminal of said motor and said comparing means such that the forward direction of said diode coincides with the direction of flow of current toward said comparing means.

17. A motor current detection circuit according to claim 16, wherein said restricting means further comprises a resistor connected to said rectifier element in parallel.

18. A motor current detection circuit for detecting an overload of a motor by detecting an increase in motor current, comprising:

comparing means for comparing said motor current and a current value corresponding to an overload detection level;

detection level changing means for changing said current value corresponding to the overload detection level in accordance with variation in motor drive voltage; and restricting means for restricting an amount of variation in the current value corresponding to the detection level, when the current value corresponding to the detection level is changed by said detection level changing means in accordance with a decrease in said motor drive voltage, so that the amount of variation in the current value corresponding to the detection level is prevented from exceeding a predetermined amount, wherein said restricting means comprises a resistor connected to a rectifier element in parallel, said rectifier element provided between one terminal of said motor and said comparing means such that the forward direction of said diode coincides with the direction of flow of current toward said comparing means.

* * * * *